United States Patent [19]
Mercs et al.

[11] Patent Number: 5,910,995
[45] Date of Patent: *Jun. 8, 1999

[54] DSP DECODER FOR DECODING ANALOG SR ENCODED AUDIO SIGNALS

[75] Inventors: Laura Mercs, Huntington Beach; Paul M. Embree, Irvine; Casper W. Barnes, Murrieta, all of Calif.

[73] Assignees: Sony Corporation of Japan, Japan; Sony Pictures Entertainment Inc., Park Ridge, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/562,286

[22] Filed: Nov. 22, 1995

[51] Int. Cl.$^6$ .................................................. H03G 7/00
[52] U.S. Cl. .............................. 381/106; 381/22; 381/23; 381/108
[58] Field of Search ............................... 381/93, 94, 106, 381/20, 21, 22, 23, 98, 100, 102, 108; 455/229, 232–233; 364/724.011–724.2

[56] References Cited

U.S. PATENT DOCUMENTS

| | | | |
|---|---|---|---|
| 4,736,433 | 4/1988 | Dolby | 381/106 |
| 4,922,535 | 5/1990 | Dolby | 381/106 |
| 5,185,806 | 2/1993 | Dolby et al. | 381/106 |
| 5,483,600 | 1/1996 | Werrbach | 381/106 |
| 5,677,951 | 10/1997 | Gay | 379/406 |

FOREIGN PATENT DOCUMENTS 7095010 4/1995 Japan.

OTHER PUBLICATIONS

Matlab user's guide, pp. 2–49, 2–50, Aug. 1982.
Simulink quick reference, pp. 8–9, 12, May 1994.
Widrow et al., Adaptive signal processing, Prentice–Hall, Inc., pp. 6–13, 1985.

*Primary Examiner*—Paul Loomis
*Assistant Examiner*—Duc Nguyen
*Attorney, Agent, or Firm*—Fulwider Patton Lee & Utecht, LLP

[57] ABSTRACT

A decoder capable of decoding audio signals encoded using analog noise reduction techniques, particularly Dolby SR, is implemented by means of digital signal processing. The typical decoding paradigm used by analog Dolby SR decoders is modified to overcome the problems caused by delay which is introduced by the digital implementation. A gain factor is factored out of the feedback transfer function and is placed in the forward signal path of each stage of the digital decoder. A single control circuit can then be used to generate coefficients which define transfer functions of each filter stage of the signal path. Linear interpolation techniques are used to limit the number of coefficient entries necessary to emulate the transfer function of an analog Dolby SR decoder. The digital decoder structure can be inverted to produce a digital encoder which is capable of implementing any noise reduction standard desired, including Dolby SR.

26 Claims, 12 Drawing Sheets

FIG. 10  AP SIGNAL GENERATOR ⇒ DOLBY SR ENCODER ⇒ SONY TYPE II RECORDER ⇒ AP SIGNAL ANALYZER

DSP DECODER FOR DECODING ANALOG SR ENCODED AUDIO SIGNALS

FIELD OF THE INVENTION

This invention pertains to audio digital signal processing and to the use of digital signal processing (DSP) in audio noise reduction systems, and more particularly to the use of DSP techniques to decode audio signals that have been encoded using analog noise reduction techniques.

ART BACKGROUND

It is recognized today that there are many advantages to recording audio information, such as music and human voices, in a fully digital fashion, as is done for example on audio compact discs (CDs). One of the biggest advantages is the elimination of noise that is inherent to the recording, mastering and playback of audio signals employing well-known analog techniques. Clearly, once the audio has been accurately encoded into numbers, there can be no corruption of the content by externally coupled noise. Despite these obvious advantages, however, analog audio recording is still widely used in certain industries, such as the film industry, in part because of their large investment in existing analog equipment. For example, there is an enormous installed base of analog playback equipment that would be incompatible with digitally formatted audio material. Moreover, there is a vast collection of exisiting subject matter which has already been recorded in an analog format and which therefore requires analog playback equipment.

When an analog audio signal is copied, edited, recorded on magnetic tape, read back from magnetic tape, or otherwise transmitted, significant noise is typically introduced in a cumulative manner at each such processing step. As a result, various noise reduction systems have been invented to lessen the impact of the noise on the quality of a recording as perceived by listeners. A typical noise reduction system transforms the captured analog audio waveform into an audio waveform having altered characteristics, for example, by boosting the waveform's amplitude in certain portions of the frequency spectrum. This transformation is referred to as "encoding." The encoded analog waveform is recorded, for example, on magnetic tape or otherwise transmitted.

As part of the playback process, the encoded waveform is subjected to a second transformation referred to as "decoding." That transformation is designed to reverse the original encoding transformation and restore the original waveform as closely as possible to its original spectral character. The overall process will achieve noise reduction if the decoding transformation is one which tends to reduce the amplitude of the kinds of noise which are typically encountered, such as low-level broadband noise. Reversing an encoding process which gains up signals at certain frequencies before noise is introduced will reduce the amplitudes of those components to their original values, while reducing any noise signals injected subsequent to the encoding process and having components at those frequencies by the same factor. A widely used noise reduction system is Dolby SR, described in Ray Dolby, "The Spectral Recording Process," 35 J. Audio Eng. Soc. 99 (1987), the entirety of which is incorporated herein by this reference.

Because the motion picture industry continues to record, mix and play back its audio subject matter using analog techniques, audio noise reduction systems implemented in the film industry have heretofore been implemented exclusively through analog signal processing techniques (i.e. using circuits made up of resistors, capacitors, operational amplifiers and other analog electronic components). A number of significant disadvantages inhere to the analog implementation of noise reduction processes. For example, problems arise as a consequence of manufacturing-lot and temperature variations in the values of the resistors and capacitors used to implement the analog circuits, in the offset voltages and other parameters of operational amplifiers, etc. Moreover, environmental conditions can also cause drifts in such parameters. In a noise reduction system, such variations could result in a mismatch between the circuit which encodes and the circuit which decodes, leading to discemable differences between the original input waveform and the decoded waveform. Such analog implementations are also inflexible, requiring changes in components or component values to achieve upgrades, redesigns or to customize characterisitics.

Digital signal processing equipment has been steadily declining in cost and increasing in capability over the past decades. Many signal processing tasks which were formerly carried out through analog circuits are now performed primarily through digital signal processing. Digital signal processing offers the possibility of circuits having lower cost, smaller size, and lower power consumption, particularly when a number of signal processing functions can share one digital signal processor. Digital signal processing makes available to the designer filters with transfer characteristics which would be difficult to realize economically with analog signal processing circuitry. Digital signal processing also avoids many of the problems which exist in analog signal processing circuits. For example, the manufacturing-lot and temperature variations referred to above are not a problem in digital signal processing; because the coefficient values that define a filter in DSP are stored as digital quantities, they do not vary from one manufacturing lot to another, nor do they vary with temperature. Moreover, DSP systems are extremely flexible in that they can be refined, redesigned or adjusted by simply loading new software with which to configure the DSP processor.

While techniques have become known in the art for designing digital signal processing systems which merely implement digitally preexisting analog signal processing systems, certain noise reduction systems of the type exemplified by Dolby SR cannot be implemented simply by straight-forward conversion into an analogous digital signal processing system. Indeed, the common wisdom in the industry is that the decoding of known analog noise reduction schemes such as Dolby SR cannot be successfully implemented digitally. The reason for this resides in the fundamental strategy which Dolby SR and similar analog systems employ for decoding.

FIGS. 1a and 1b depict a high-level representation of the structure employed by Dolby SR to encode and decode audio signals respectively. The signal X 105 to be encoded passes through an encoding block 110, the output of which is added to the original signal by an adder 115, producing the encoded audio signal Y 120. During playback, an audio signal $Y_N$ 145 (which is the encoded signal Y 120 and which has had noise introduced to it through the various analog recording, mixing and playback processes as previously discussed) is decoded to produce an audio signal $X_n$ 135 which represents the original audio signal X 105, with any noise introduced through recording, mixing, etc. having been reduced. The decoding process operates by employing an encoding block 130, the transfer function of which is identical to that of the encoding block 110 used to encode the original signal X 105. The reconstructed (i.e. decoded) signal $X_n$ 135 is fed back to encoding block 130 to produce an encoded version of the reconstructed signal which is then subtracted from the encoded signal $Y_N$ by adder 125 to produce the reconstructed signal.

In effect, the decoder assumes what the reconstructed output $X_n$ should be and then uses it to produce a signal from encoding block 130 which is, with respect to all spectral components of the signal $X_n$ except the noise, exactly what was added to the original signal X 105 during the encoding process. By subtracting this signal from the encoded signal $Y_N$, the reconstructed signal $X_n$ is produced. The advantage of this scheme is that the two encoding blocks 110 and 130 can be identical, and if one ignores any noise which may have been introduced into the encoded signal 120 between encode and decode, then the decoded signal 135 is guaranteed to be identical to the encoded one.

This playback scheme essentially assumes that the decoded signal 135 is the original unencoded signal 105 and uses a sample of the decoded signal 135 at time $t_1$ to calculate that signal 140 which must be subtracted from the encoded signal 145 at time $t_1$ to produce the original output. Because the delay through the feedback loop is minimal using analog circuits, this system will not be unstable for frequencies over the audio range.

The structure of FIG. 1*b* is not suited for straightforward conversion to a digital signal processing implementation. Such a straightforward conversion of the decoder of FIG. 1*b* would simply replace the analog encoding block 130 with a digital signal processor having a transfer characteristic which is virtually identical. While it is possible using techniques known in the art to program a digital signal processor to closely imitate the amplitude gain of analog encoding block 130 (see, for example, Alan V. Oppenheim & Ronald W. Schafer, *Discrete-Time Signal Processing* sec. 7.1 (1989)), any digital signal processing implementation of that encoding block would inevitably introduce a delay $t_D$ between the time $t_1$ that a sample of the decoded signal 135 is available and the time $(t_1 + t_D)$ that the value generated from that sample by the encoding block 130 becomes available. Because of this delay, it is impossible to generate the decoded signal 135 by subtracting from the current sample of the input signal 145 the value generated by encoding block 130 from that sample; rather, the only feasible way to generate decoded signal 135 is to subtract from the current sample of the input signal 145 the value generated by encoding block 130 from the previous sample of input signal 145. This introduces a delay of at least one sample period into the feedback loop of the decoder of FIG. 1*b*.

In audio processing, samples are generally taken at a rate of 44.1 kHz, i.e. approximately every 23 $\mu$s. As is well known, delays in feedback loops tend to make systems unstable. In the case at hand, it is found that the one-sample-period delay renders a straight conversion of the structure of FIG. 1*b* unstable for certain frequencies over the audio range and therefore unusable. Thus, to produce the result of the decoding scheme of FIG. 1*b* digitally, a radically different approach must be invented to compensate for the digital delay. The scheme must be emulated rather than imitated.

In sum, a straightforward conversion of the analog circuitry is not possible, but because of the many cost and performance advantages that could be realized using DSP, there is a need in the art for a method of digitally decoding Dolby SR-type and similar decoding systems; such an implementation must employ a different overall structure from that of existing analog decoders to emulate rather than imitate the analog process.

SUMMARY OF THE INVENTION

It is therefore an objective of the present invention to overcome the heretofore unresolved problem of achieving stable operation of a digitally implemented noise reduction decoder in spite of feedback loop delay inherent to a straight conversion of such analog noise reduction decoders of the same general type as Dolby SR to a DSP solution. It is a further objective of the invention to emulate closely the overall transfer function of the analog decoder of a Dolby SR-type noise reduction system so that the audio signal recovered using the present invention is not discernably different than if it had been recovered by an analog Dolby-SR noise reduction decoder. It is a further objective of the invention that a digital signal processing system be able to employ the inverse of the decoder of the present invention to perform encoding as well as decoding, so that it has the flexibility to encode an input waveform in any manner which is desirable, including but not limited to the Dolby SR standard.

The instant invention comprises a filter section and a control section. The filter section provides a signal path through which an encoded audio signal is altered by an adaptable transfer function to produce an audio signal output which is virtually identical to the original audio signal, plus some reduced amount of noise. In the preferred embodiment, the effect of this adaptable transfer function is to emulate through digital signal processing techniques, that transfer function realized by well-known analog decoding under Dolby SR noise reduction standards.

The signal path comprises three cascaded filter stages. The input to the first of these filter stages is the encoded audio signal to be decoded. The output of the last of these three filter stages is input to a deskewing filter, the output of which is the decoded or reconstructed audio signal. The first of the three filter stages comprises a gain section in its forward signal path, and a high frequency filter section and a low frequency filter section in its feedback signal path. The output of the gain section is fed back to the high frequency and low frequency filter sections, and is also input to the second filter stage. The outputs of the high frequency and low frequency filter sections are subtracted from the audio signal to be decoded by a summing circuit, the output of which becomes the input to the stage's gain section.

The second filter stage is identical to the first filter stage, with the output of its gain section providing the input to the third filter stage. The third filter stage is identical to the first two stages except that it only has a high frequency filter section in the feedback signal path. The output of the gain section of the third stage becomes the input to the deskewing filter.

The control section provides coefficients to each of the three filter stages by which the transfer function of the three filter stages can be adapted in accordance with the current value of the decoded audio signal output. The control circuit is divided into a high frequency section and a low frequency section. The high frequency section provides coefficients by which to configure the high frequency filter sections of each of the three filter stages. The low frequency section provides coefficients by which to configure the low frequency filter sections of the first two filter stages. The high frequency and low frequency control sections also provide coefficients by which to determine the gain provided by each of the gain sections of the filter stages.

The low frequency control section includes a low frequency coefficient table containing 1056 sets of coefficients for 176 frequencies by six amplitudes. Each table entry contains a total of five coefficients. Four of the coefficients are used to configure the low frequency filter sections of the first and second filter stages. The remaining coefficient is input to the gain sections of the first two filter stages to be used in determining the gain value of those gain sections.

The high frequency control section includes a high frequency coefficient table, also having 1056 entries for 176 frequencies by six amplitudes. Each of the table entries contains five coefficient values. Four of the coefficient values are input to the high frequency filter sections of each of the three filter stages, and are used to configure the transfer functions of those filter sections. The remaining coefficient is input to the gain sections of each of the three filter stages, and is used to determine the gain value of those gain sections.

Each of the control sections is further subdivided into two subsections. The first subsection of the low frequency control section includes a fixed low-pass filter, which receives as its input the recovered audio signal. The output of this fixed low-pass filter is rectified to determine the largest amplitude of the recovered audio signal below the cutoff frequency of the low-pass filter. This amplitude value is then scaled into dB and is one of two inputs which are used to index the low frequency coefficient table to select the appropriate low frequency coefficients.

The first subsection of the high frequency control section includes a fixed highpass filter, which also takes as its input the decoded audio signal. The output of this fixed high-pass filter is also rectified to determine the greatest amplitude of those spectral components of the decoded audio signal above the cutoff frequency of the fixed high-pass filter. This amplitude value is also converted to dB and is one of two inputs used to index the high frequency coefficient table.

The second subsection of each of the control sections is a sliding filter which is employed to determine the frequency of the spectral component of the recovered audio signal having the greatest amplitude. The second subsection of the low frequency control section includes two low-pass filters. The transfer functions of the low-pass filters are different such that a ratio between the outputs of the two filters will, when rectified, define the frequency of the spectral component having an amplitude equal to the output of those filters. The outputs of each of the two low-pass filters are rectified to determine the greatest amplitude of the spectral components of the decoded audio signal below the cutoff frequencies of those two low-pass filters. The ratio of the two amplitudes is taken to determine the frequency of the spectral component having the greatest amplitude. The output is converted to a $\log_2$ scale to achieve greater resolution at lower frequencies. The scaled output is used as the other of two inputs by which index the appropriate low frequency coefficients from the low frequency table are selected.

The second subsection of the high frequency control section includes two high-pass filters, the outputs of which are rectified and ratioed to determine the dominant spectral component of the decoded audio signal having a frequency above the cutoff frequency of the high-pass filters. The ratio is also scaled to $\log_2$ and is the other of two inputs by which the appropriate high frequency coefficients are selected from the high frequency coefficient table.

Thus, the low frequency coefficient table and high frequency coefficient table are indexed two-dimensionally to identify the entry from which the coefficients are to be provided to the filter stages in the signal path.

The high frequency and low frequency filter sections of the filter stages are implemented as two-pole Butterworth filters. Each of the high frequency and low frequency filter sections is realized as a second-order biquadratic filter programmed to implement the two-pole Butterworth filter.

Finally, the decoder of the present invention can be inverted to produce an encoder which is universally programmable by which any desirable encoding standard can be achieved, including the Dolby SR encoding standard. To achieve such desirable standards, only the coefficient tables and/or the filter functions need by reprogrammed.

BRIEF DESCRIPTION OF THE DRAWINGS

FIG. 5a (prior art) is a high-level paradigmatic representation of a stage of the encoder of FIG. 2a.

FIG. 5b illustrates a block-level paradigmatic representation of an altered encoder stage whereby a gain has been factored out of the transfer function H(z) of FIG. 5a.

FIG. 5d is a block-level representation of an encoder stage derived from the modified encoder of FIG. 5b and as applied to one of the filter stages of the encoder of FIG. 2a.

DETAILED DESCRIPTION OF THE INVENTION

1. The Dolby SR Noise Reduction Standard

Figure 1A:
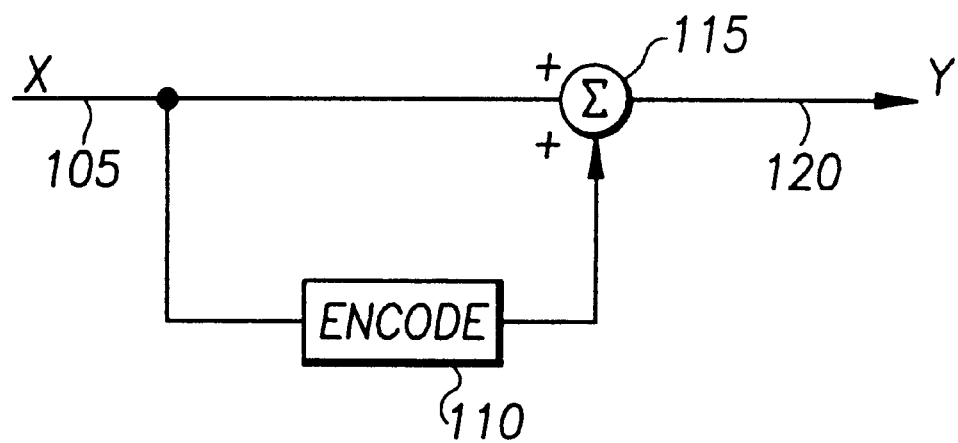
FIG. 1a (prior art) depicts the high-level structure of existing analog encoders for noise reduction systems like Dolby SR.
Figure 1B:
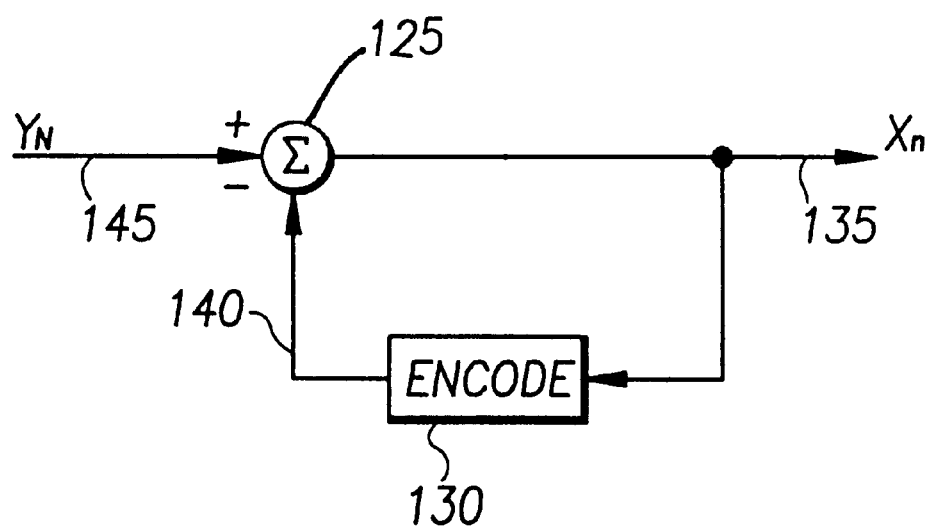
FIG. 1b (prior art) depicts the high-level structure of existing analog decoders for noise reduction systems like Dolby SR.
Figure 2A:
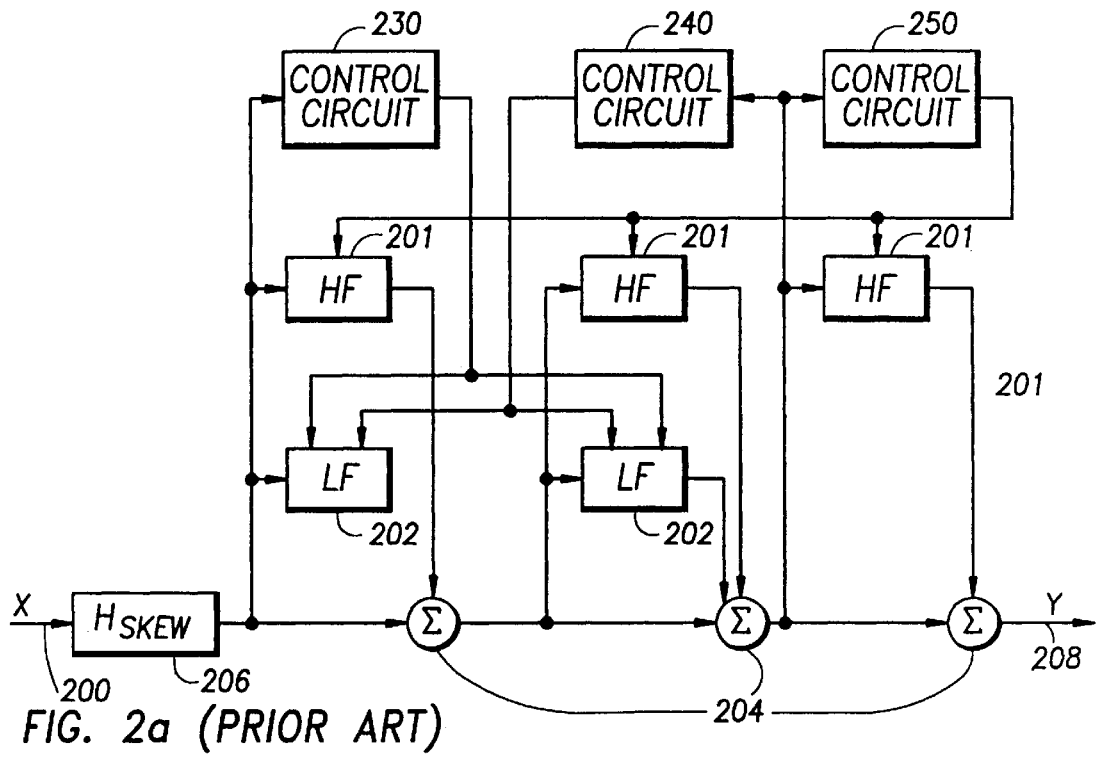
FIG. 2a (prior art) depicts a simplified block diagram of a Dolby SR analog encoder.
Figure 2B:
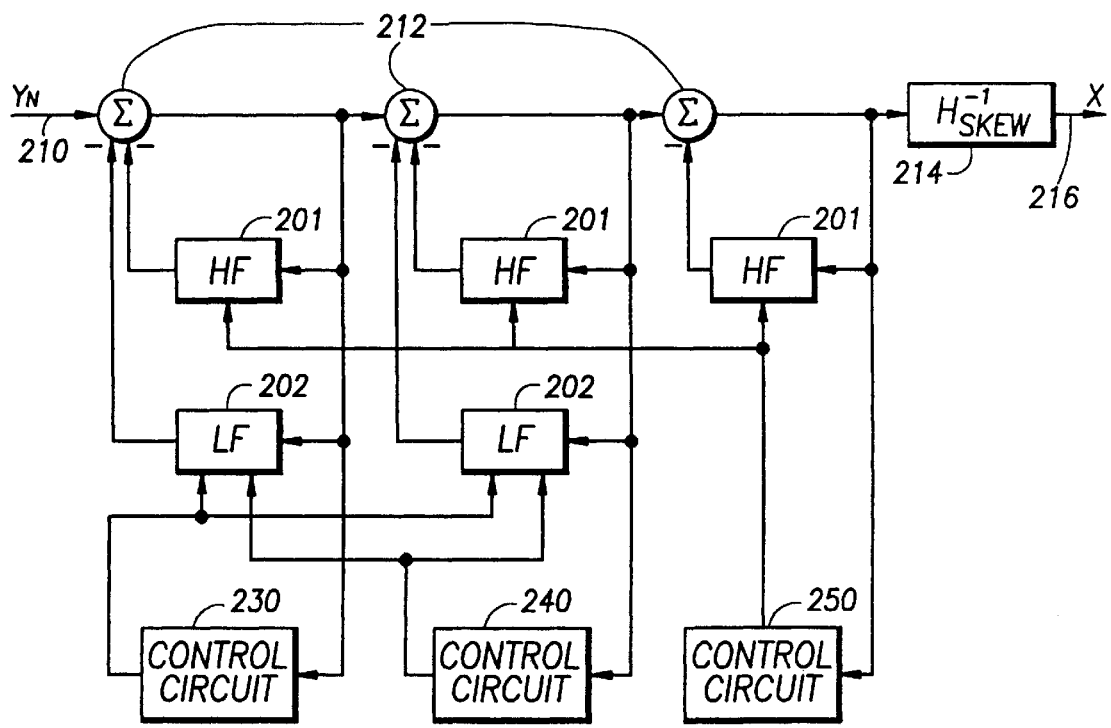
FIG. 2b (prior art) illustrates a simplified block diagram of Dolby SR analog decoder.

FIG. 2a illustrates the simplified diagram of an analog encoder typically used to implement the well-known Dolby SR noise reduction standard. FIG. 2b is a block-level illustration of a typical analog implementation of a Dolby SR decoder. Each of the three cascaded filter stages of the encoder in FIG. 2a corresponds to the high level structure disclosed in FIG. 1a. Likewise, each of the three filter stages of the decoder FIG. 2b correspond to the high level representation of the analog decoding process depicted in FIG. 1b. The purpose of the encoder of FIG. 2a is to determine at any instant in time, the dominant spectral component of the audio signal to be encoded, and to boost the gain of the audio signal to be encoded at the frequencies other than at the dominant component. Even the dominant spectral component will be boosted somewhat in gain, commensurate with its relative amplitude. This is a vast improvement over other standards, such as Dolby A, which boosted the gain of a fixed number of spectral components (i.e., frequency bands). Thus, the encoder continuously adapts the overall transfer function between the input and the output of the encoder in response to the dominant spectral component of the decoded output signal at any instant in time.

The signal path of the analog encoder includes three filter and control stages which produce the transfer function by which the incoming audio signal X 200 is encoded to produce encoded output Y 208. Control circuits for each of the stages dictate the transfer function of each of the stages individually.

Figure 3:
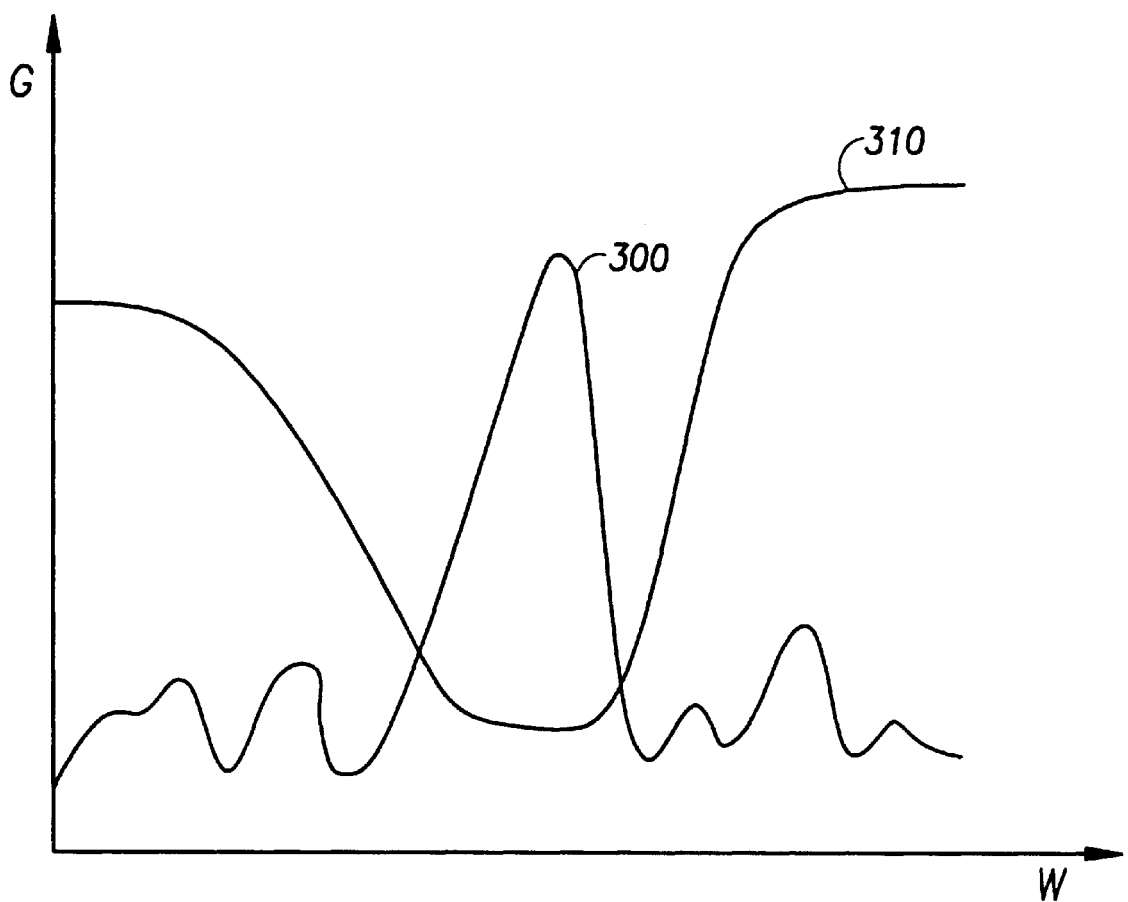
FIG. 3 (prior art) illustrates an example of a transfer function generated by an analog Dolby SR encoder based on the dominant spectral component of an audio signal to be encoded.
Figure 4A:
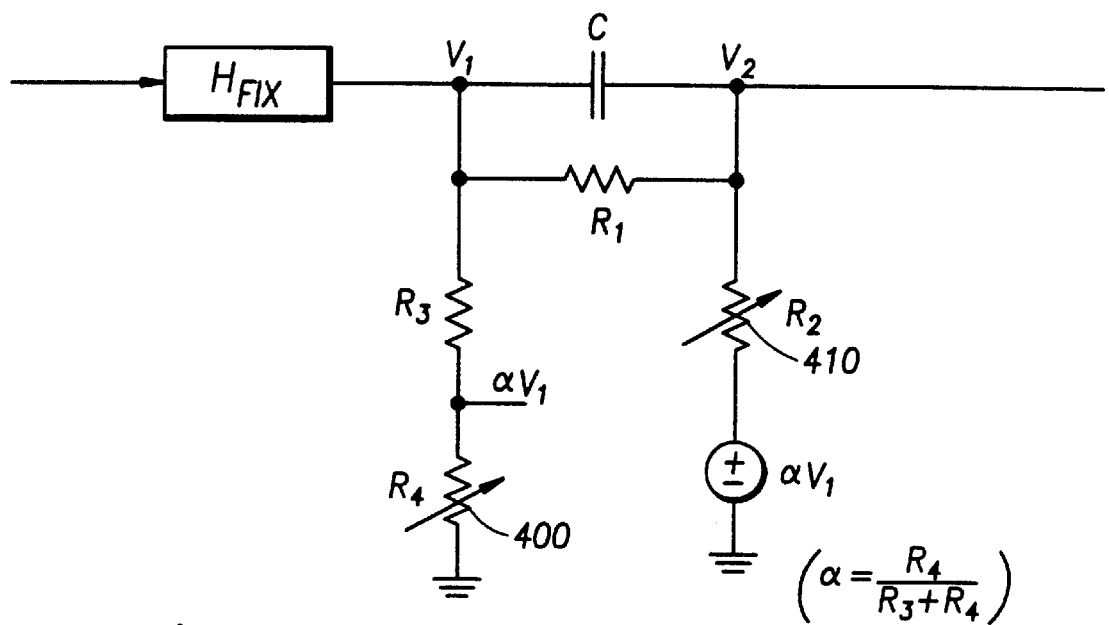
FIG. 4a (prior art) illustrates a typical analog implementation of the high frequency (HF) module of FIGS. 2a and 2b.
Figure 4B:
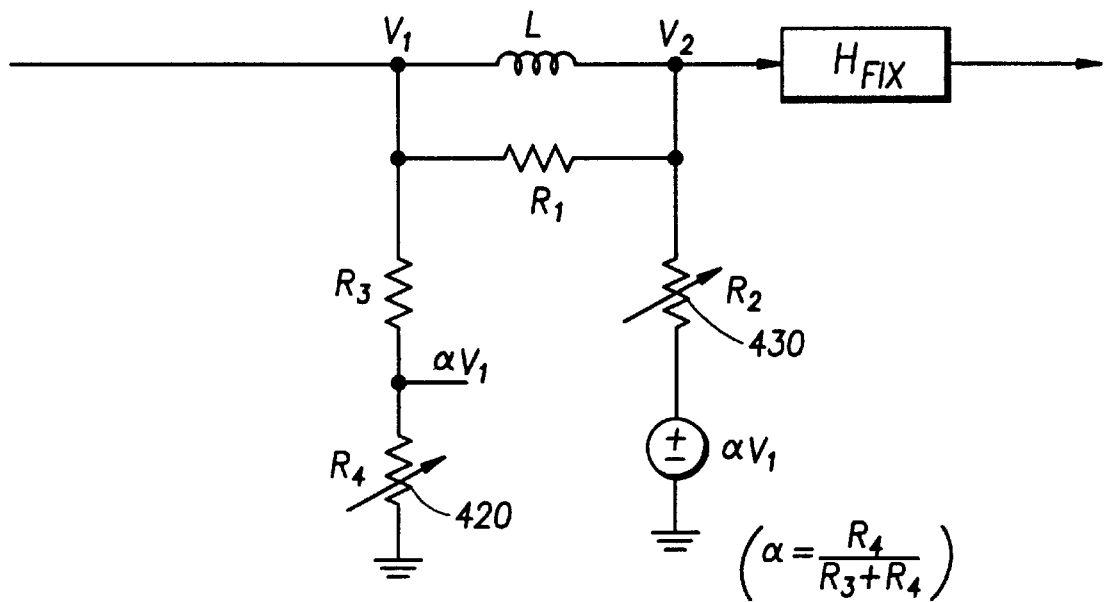
FIG. 4b (prior art) is a typical analog implementation of the low frequency (LF) module of FIGS. 2a and 2b.

The high frequency filter sections of the first and second stages are typically implemented as shown in FIG. 4a. Variable resistors R4 400 and R2 410 are controlled by control circuits 250. The low frequency filter sections of the first and second stage are typically implemented as shown in FIG. 4b. Variable resistors 420 and 430 are controlled by control circuits 230 and 240. A skewing filter 206 is typically employed under the Dolby SR standard, which attenuates very low frequencies below 40 Hz and very high frequencies above 10 kHz to prevent these extreme frequencies from interfering with the operation of the encoder. FIG. 3 illustrates what the overall transfer function 310 of the encoder of FIG. 2a would typically be when the incoming audio signal to be encoded has a spectral content 300. It can be seen from FIG. 3 that the encoder of FIG. 2a will gain up those spectral components on either side of the dominant spectral component to essentially decrease the dynamic range of the incoming signal at that instant in time. Some gaining up of the dominant frequency may also occur.

2. The Preferred Embodiment of the Invention

As previously discussed, digital implementation of an encoder capable of decoding audio signals that have been encoded in an analog fashion using noise reduction techniques such as Dolby SR, although highly desirable, has been heretofore unsuccessful because direct conversion of analog decoders (as illustrated in FIG. 2b) are unstable due to the delay introduced by digital signal processing (DSP) techniques. The present invention successfully provides an emulation of the decoder of FIG. 2b through a novel and non-obvious approach which modifies the fundamental paradigm for decoding.

Figure 5A:
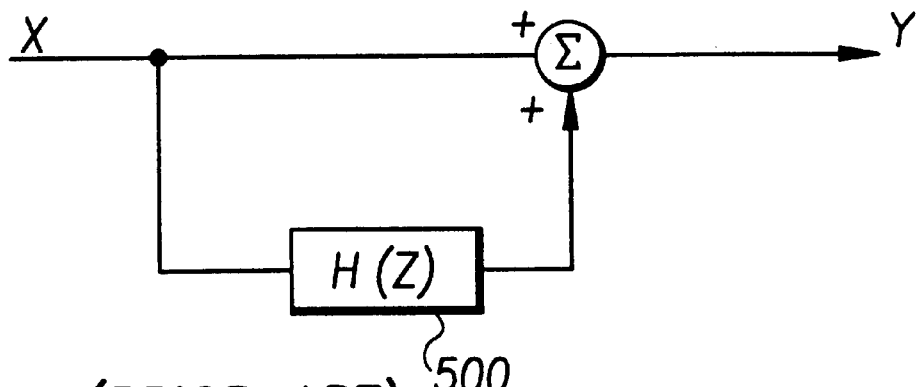

Each filter stage of the encoder of FIG. 2a can be represented by the high-level block diagram of FIG. 5a. Block 500 represents an encoder having a transfer function represented by H(z). H(z) is a discrete-time transfer function which can be represented by the following equation:

$$H(z) = \frac{b(z)}{a(z)} = \frac{b_0 z^N + b_1 z^{N-1} + \ldots}{z^N + a_1 z^{N-1} \ldots}$$

If we divide a(z) into b(z) using polynomial division, H(z) can be expressed as follows:

$$H(z) = b_0 + \frac{c(z)}{a(z)} = b_0 + H'(z)$$

Figure 5B:
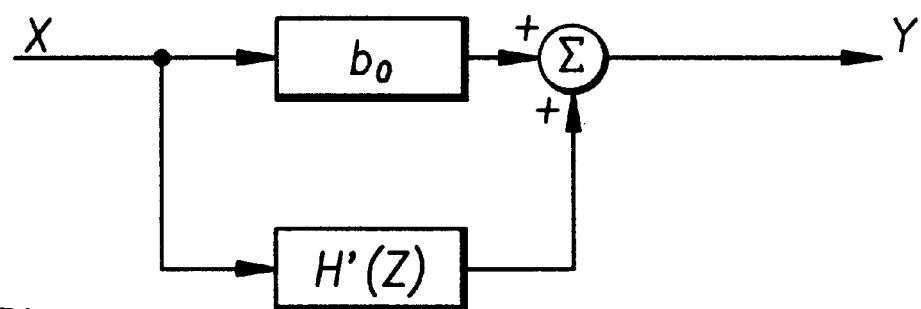

The results of this process can be illustrated by the block diagram of FIG. 5b.

Figure 5C:
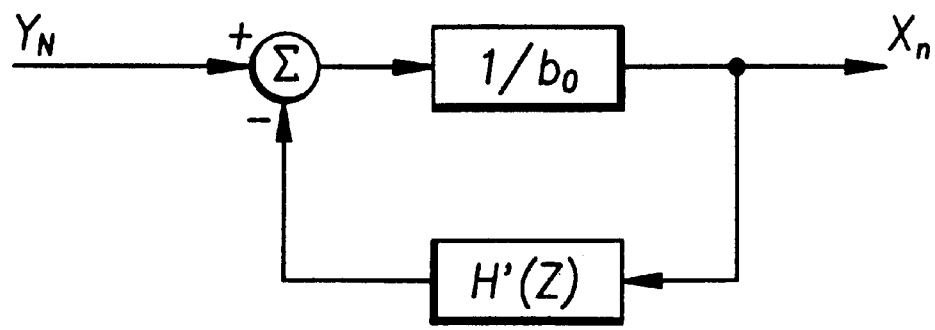
FIG. 5c illustrates a block-level representation of an altered decoder stage whereby a gain has been factored out of the feedback transfer function H(z).

The inverse of this transfer function can be realized using a feedback loop as illustrated in FIG. 5c. Because H'(z) is a proper rational function, there are no delay-free loops in this implementation. This high-level approach as illustrated in FIGS. 5b and 5c can then be applied to each filter stage of the signal path of the analog encoder of FIG. 2a and the analog decoder of FIG. 2b. For each filter stage, the transfer function is given by the following:

$$H(z)=1+HF(z)+LF(z)$$

Figure 5D:
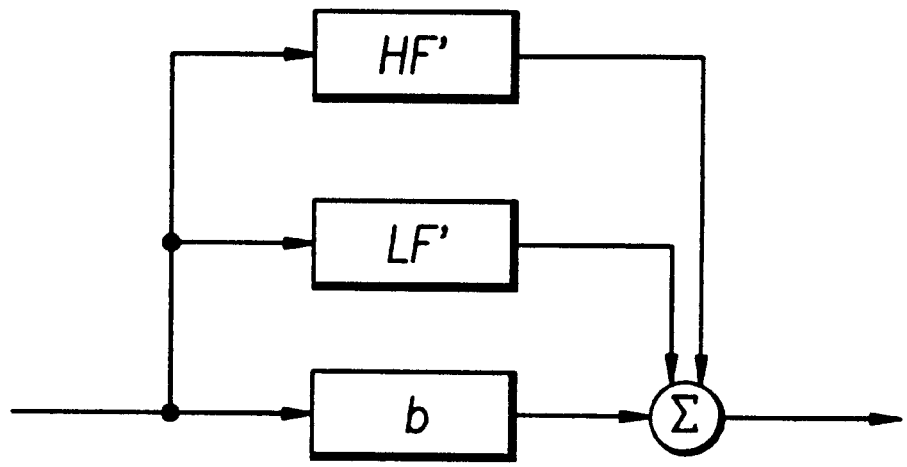
Figure 5E:
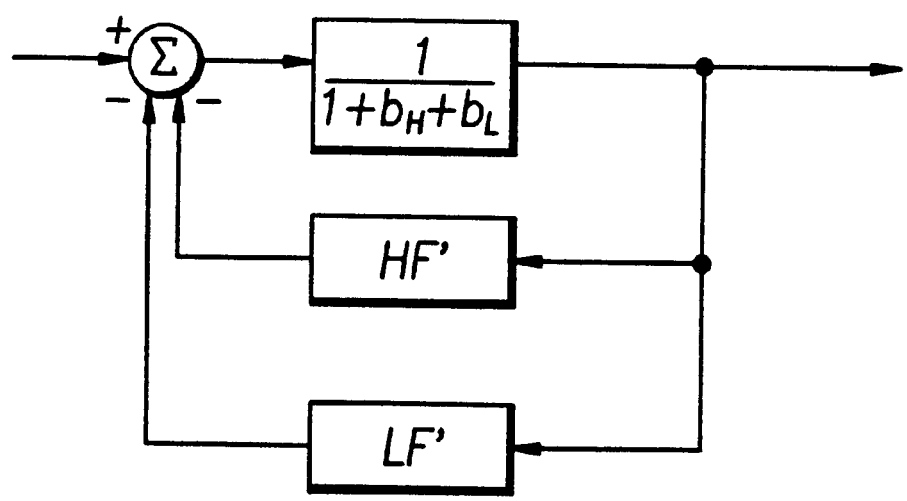
FIG. 5e is a block-level illustration of a decoder stage derived from the modified encoder stage of FIG. 5c.

For the last stage, LF(z) equals 0. The above equation can be rewritten as follows:

$$H(z)=b+HF'(z)+LF'(z)$$

where HF'(z) and LF'(z) are proper rational functions. Each stage of the encoder of FIG. 2a can then be implemented as shown in FIG. 5d while each stage of the decoder of FIG. 2b can be implemented as illustrated in FIG. 5e. Based on the above modification of the paradigm for analog encoding, the analog decoder can now be implemented digitally because there will no longer be any delay-free loops, as is the case for the decoder of FIG. 2b.

Figure 6:
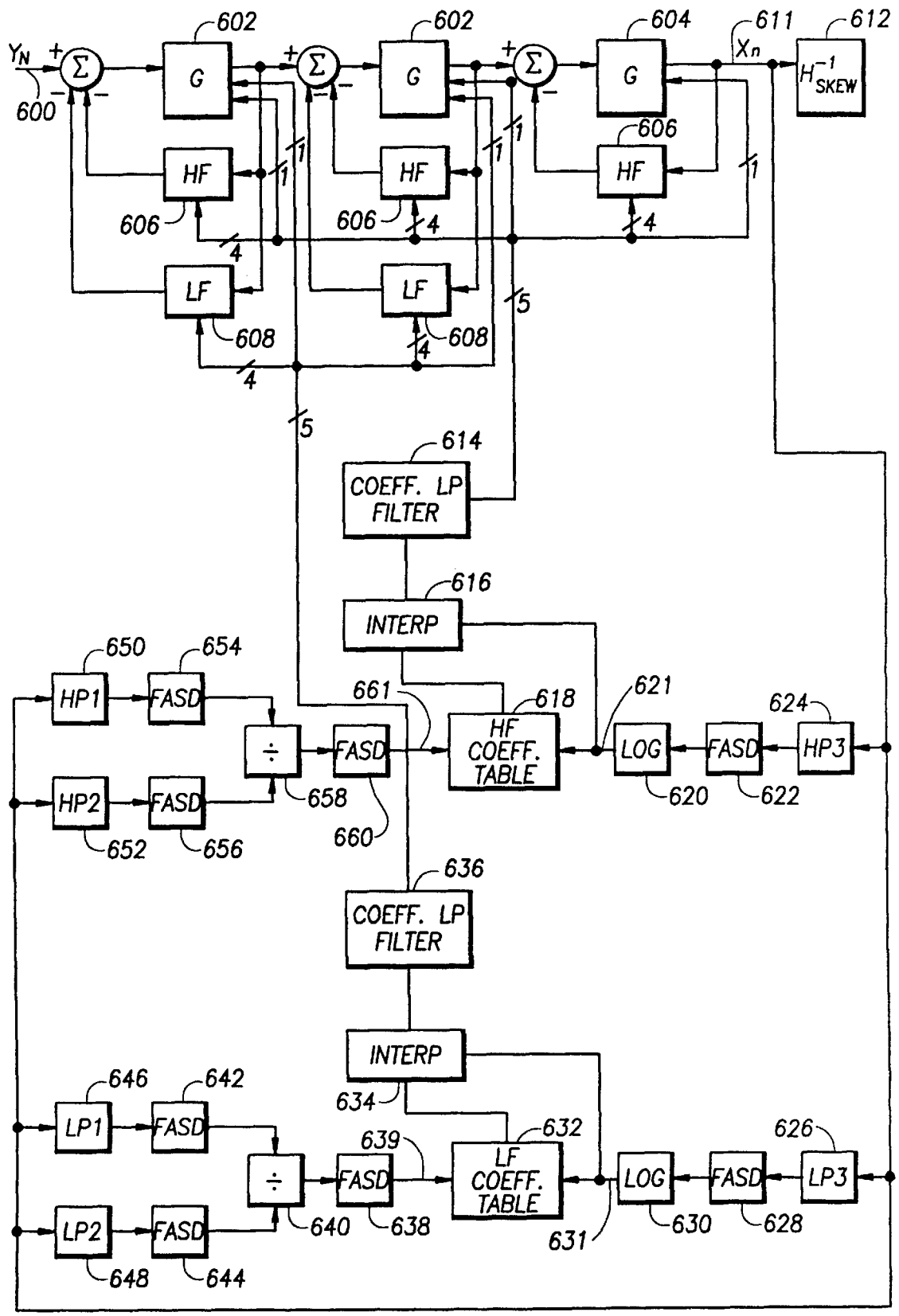
FIG. 6 is a block-level diagram of the preferred embodiment of the decoder of the present invention.

FIG. 6 is a block-level depiction of the preferred embodiment of the noise reduction decoder of the present invention. The decoder of the present invention can be viewed as divided into two sections, a signal pass section and a control section. The signal pass section employs three filter stages in cascade. Each of the filter stages is implemented in accordance with the modified paradigm of FIG. 5e. Each of the high frequency filter sections 606 and the low frequency filter sections 608 are implemented as second-order biquadratic filters to implement two-pole Butterworth filters. The transfer functions for each of the filter sections 606 and 608 are determined by a set of four coefficients. The digital implementation of the filter sections 606 and 608 will be readily apparent to those of skill in the art from the MATLAB description of the present invention which is attached hereto as Appendix A. The gains produced by gain sections 602 in the forward signal path are determined by two coefficients, one being a factored gain component from the high frequency component of the feedback transfer function (i.e., HF') of the filter stage, and the other being a gain component factored from the low frequency component (i.e., LF') of the feedback transfer function. For gain stage 604, because the low frequency component of the transfer function is equal to 0 (i.e., HL'=0), the value of the gain does not include a factor from a low frequency component. Thus, the gain value produced by gain block 604 is only determined by one coefficient.

The signal path section also includes an additional filter $[H_{skew}^{-1}]$ 612, which is simply the inverse transfer function of the skew filter 206 of FIG. 2a. Put another way, it is a direct digital implementation of the inverse skew filter 214 of FIG. 2b.

The control section takes as its input the output $X_n$ 611. This signal represents the reconstructed or decoded audio signal with reduced noise prior to being de-skewed. The control section produces five high frequency coefficients, four of which are input to each of the high frequency filter sections 606 by which their transfer functions are determined, and one coefficient which provides the high frequency gain component for the gain sections 602. The control circuit also provides five low frequency coefficients, four of which are input to the two low frequency filter sections 608 and one which is used to determine the low frequency contribution to the gain stages 602. The low frequency control section includes a low frequency coefficient table 632 which contains a total of 1,056 entries, each of which contains five low frequency coefficients. Each entry of five coefficients corresponds to 176 frequencies by six amplitudes. The six amplitudes are 0 dB, –10 dB, –20 dB, –30 dB, –40 dB and –60 dB. The mapping used to generate the indexes for accessing the coefficients for the low frequency coefficients table 632 and the manner by which the maps are used to generate the coefficients is disclosed in the MATLAB description of the invention as attached as Appendix A.

The coefficients are selected based upon inputs 631 and 639. Signal 631 is generated by first running the decoded signal $X_n$ 611 through a low pass filter LP3 626, the output of which is in turn rectified by Fast Attack/Slow Decay (FASD) circuit 628, the output of which is in turn converted to dB by block 630. Signal 631 represents the highest amplitude of the recovered audio signal at time t for frequencies below the cutoff frequency of filter 626. Signal 639 is generated by a sliding filter which determines the frequency of the dominant spectral component of the decoded signal at time t. Signal 639 is determined by the ratio of the rectified output of two low pass filters 646 and 648. The ratio value is also rectified by block 640. The implementation of filters LP1 646, LP2 648, and LP3 626, are disclosed in the MATLAB description of the preferred embodiment which is attached as Appendix A.

Figure 7:
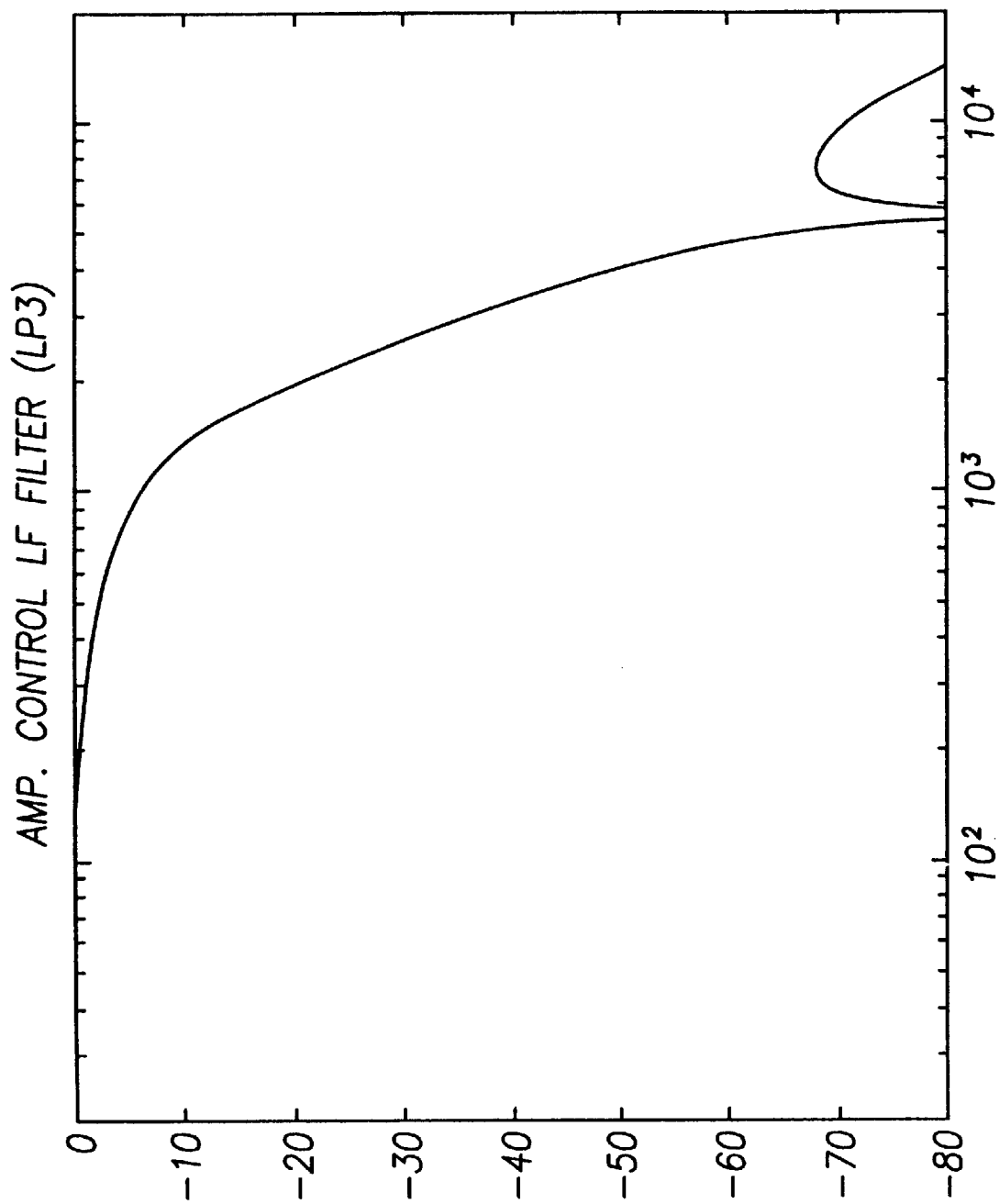
FIG. 7 is an illustration of the transfer function of the low-pass filter LP3 of FIG. 6.
Figure 9:
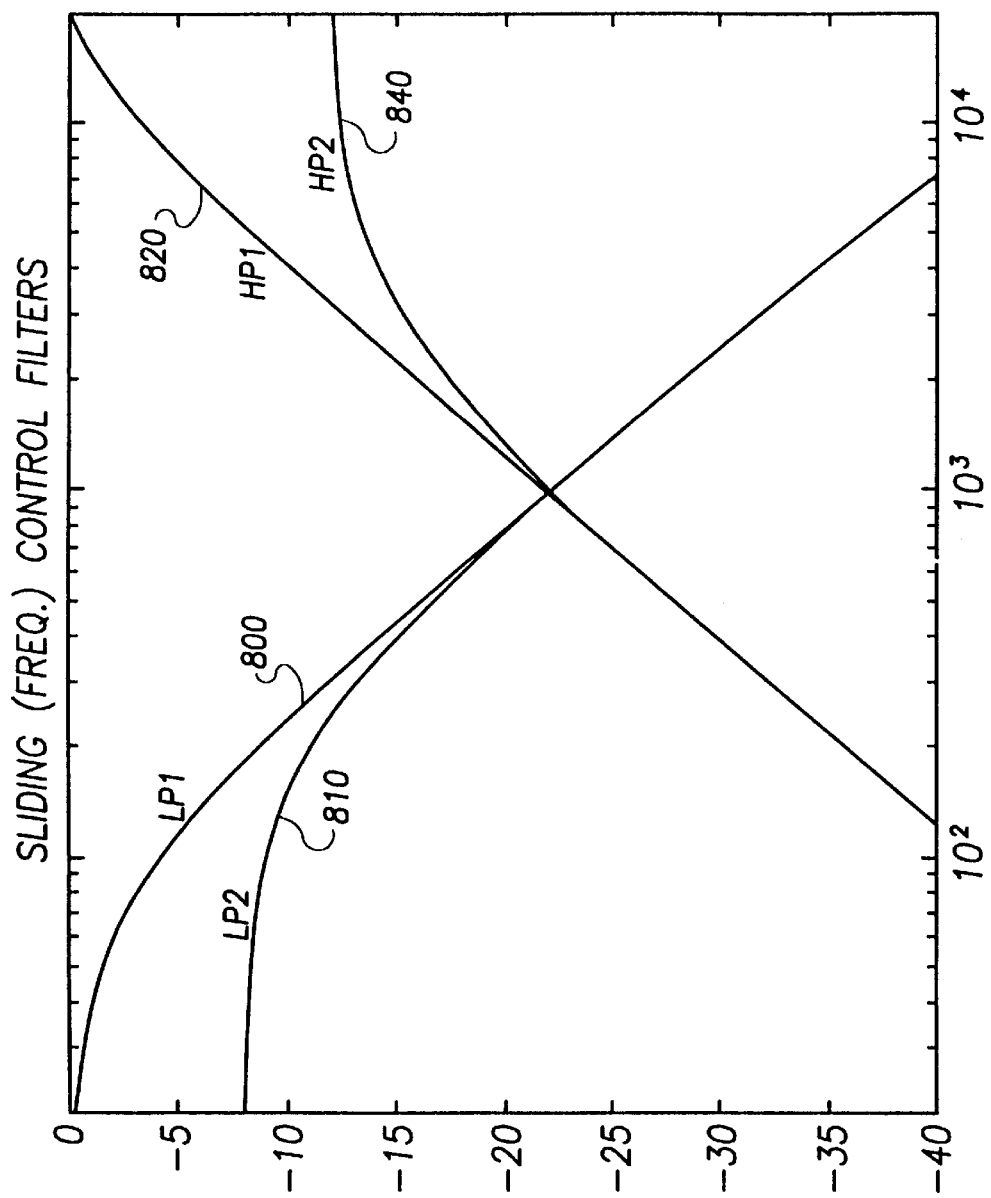
FIG. 9 is an illustration of the transfer functions for low-pass filters LP1 and LP2, as well as the high-pass filters HP1 and HP2 of FIG. 6.

FIG. 7 illustrates the transfer function of filter LP3 626. FIG. 9 illustrates the transfer functions 800 and 810 of the filters LP1 646 and LP2 648, respectively.

Figure 8:
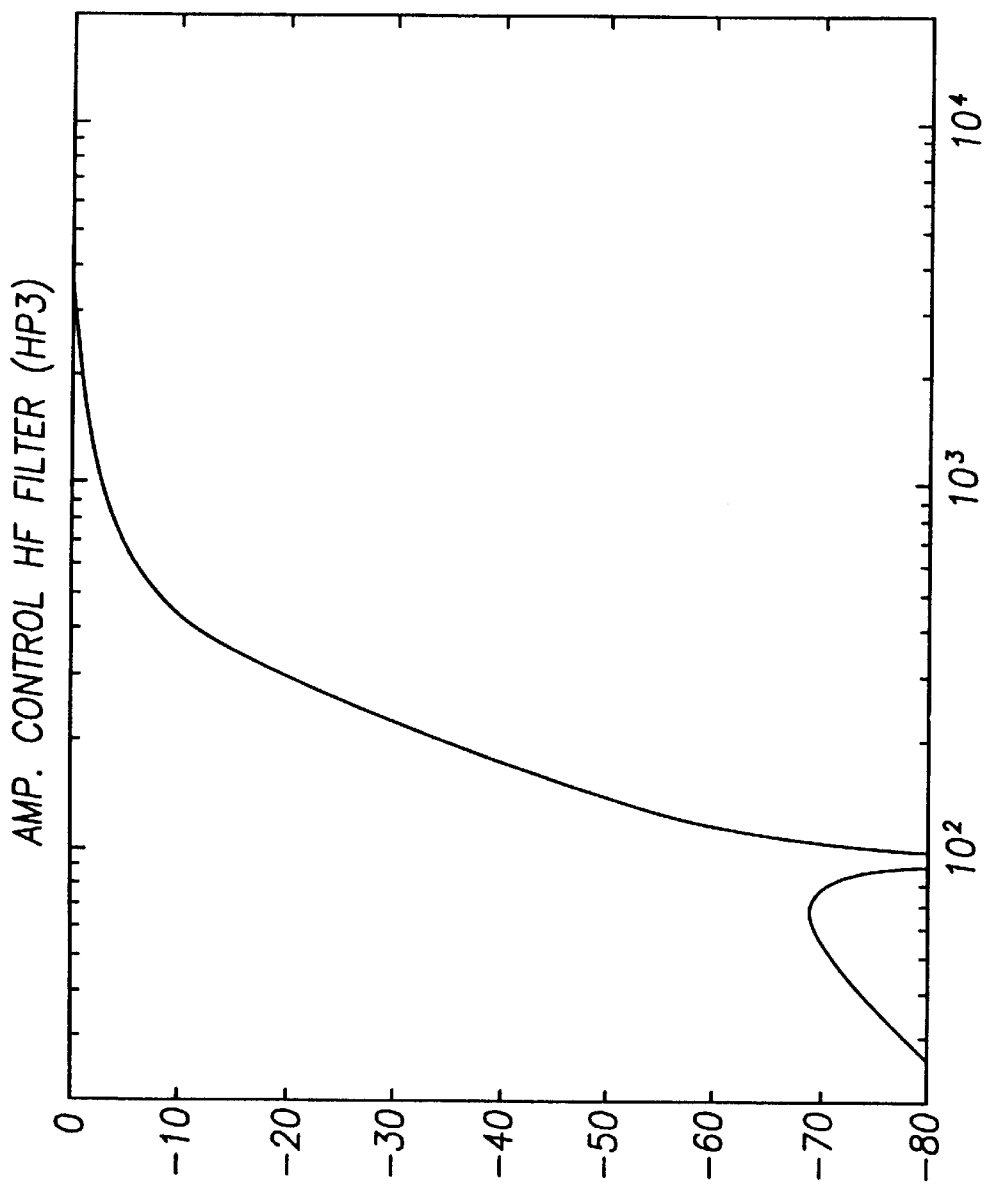
FIG. 8 is an illustration of the transfer function of the high-pass filter HP3 of FIG. 6.

Coefficients for the high frequency filter sections 606 and for the high frequency gain component for gain section 602 and 604 are supplied from high frequency coefficient table 618. High frequency coefficient table 618 also has 1,056 entries for 176 frequencies by six amplitudes. The appropriate coefficients as dictated by the recovered signal $X_n$ 611 at time t is determined by inputs 621 and 661. These signals are generated in much the same way as the low frequency table inputs. The only difference is the use of high pass filters HP3 624, HP1 650, and HP2 652. The transfer function for high pass filter HP3 624 is illustrated in FIG. 8. The transfer functions 820 and 840 for high pass filters HP1 650 and HP2 652, respectively, are illustrated in FIG. 9.

It should be noted that the ratio outputs for producing signals 661 and 639 are $\log_2$ scaled in order to provide higher resolution at lower frequencies. Moreover, a linear interpolation of coefficient values is performed by blocks 616 and 634. Thus, if an amplitude input falls between, for example 0 dB and –10 dB, the table index is rounded up or down and the fractional portion of the amplitude value is input to blocks 616 and 634 to produce coefficients based on linear interpolation. The use of scaling and interpolation saves space in the memory by reducing the requisite number of coefficients. Finally, the coefficients are run through low pass filters 614 and 636 to prevent drastic changes in coefficient values over time to avoid distortion of the recovered signal $X_n$ 611.

A number of significant differences should be noted between the preferred embodiment of the present invention as illustrated in FIG. 6 and the prior art analog decoder of FIG. 2b. Aside from the obvious difference that the preferred embodiment of the present invention is a digital emulation of the transfer function provided by the analog decoder of FIG. 2b, a gain stage has been inserted into the forward signal path of each filter stage which provides a gain component factored out of the transfer functions of the filter sections which lie in the feedback path of each stage. This is the fundamental change in the decoding paradigm which permits the implementation of decoding using digital signal processing techniques. It should also be noted that there is only one control circuit for all of the stages of the signal path, which avoids a considerable amount of additional signal processing which is probably not possible to implement given the level of technology currently available with commercially available digital signal processors. As a result of these differences, the actual transfer functions of the high frequency and low frequency filter sections must necessarily be different than those of the analog decoder of FIG. 2b. Nevertheless, the overall transfer function between the input and the output of the analog decoder of FIG. 2b has been successfully emulated by the overall transfer function between the input and output of the decoder of the present invention.

Figure 10:
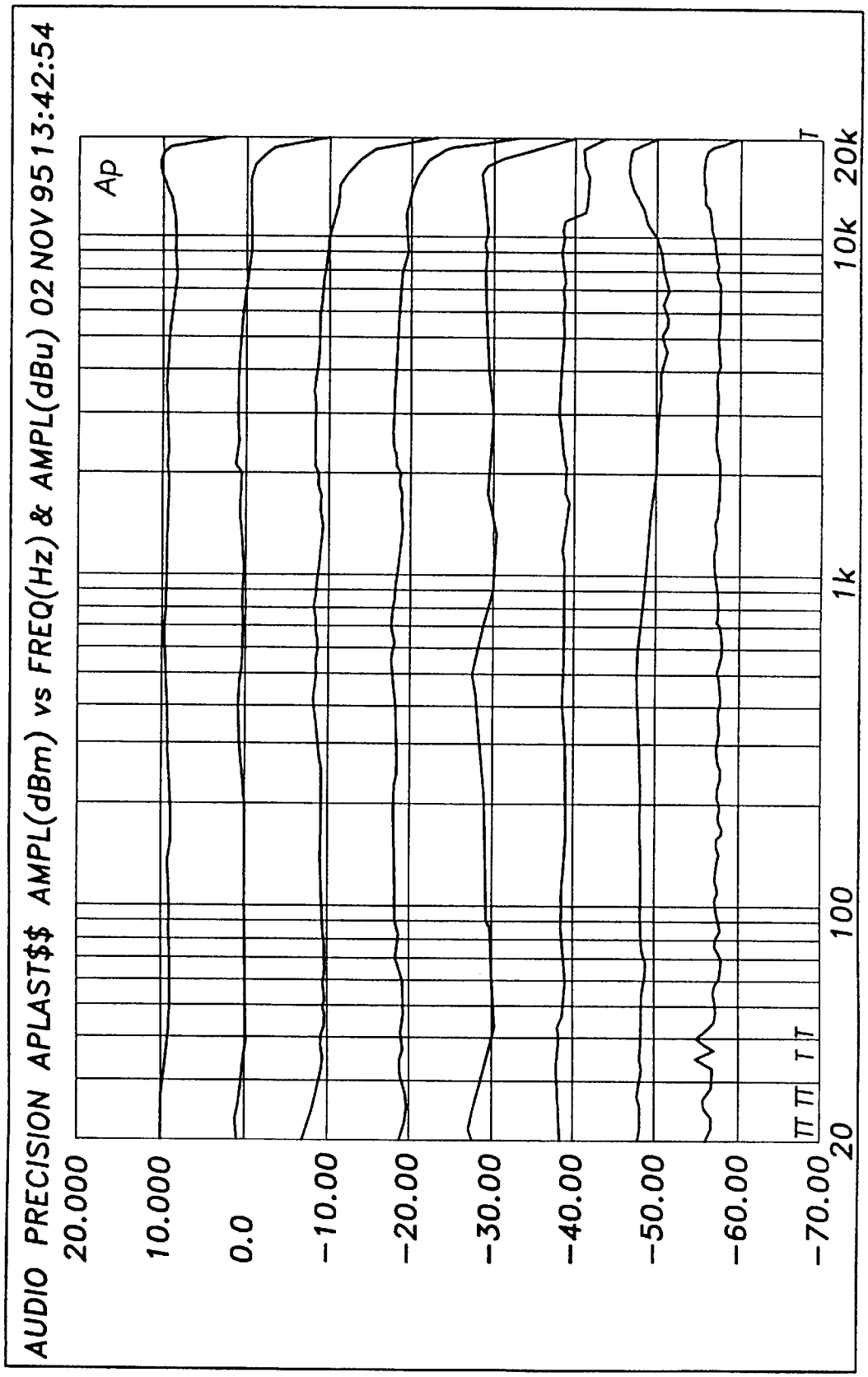
FIG. 10 is an illustration of the output of the present invention, which has decoded a sweeping tone encoded by a Dolby SR analog encoder at 10 dB intervals between 10 dB and −60 dB.
Figure 11:
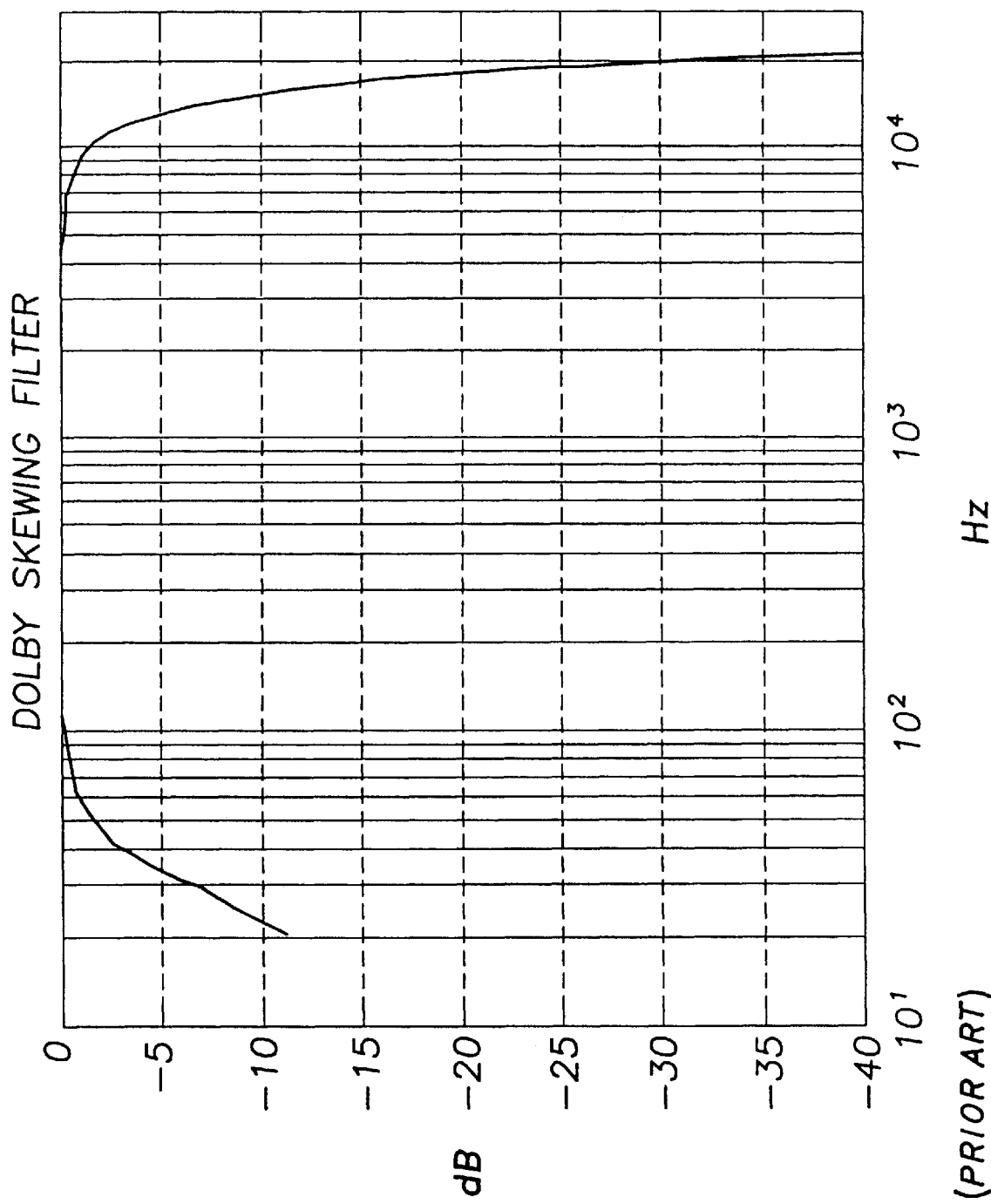
FIG. 11 (prior art) is an illustration of the transfer function of a Dolby skewing filter.

FIG. 10 illustrates a verification of the transfer function of the analog decoder of FIG. 2b. A signal generator was used to generate tones which were swept over the audio frequency range from 20 to 20 kHz and at amplitudes ranging from 10 dB to –60 dB. These signals were encoded using a standard Dolby SR analog encoder as described in FIG. 2a. The analog encoded signal was then decoded using the decoder of the present invention. The result was then run through a signal analyzer and a comparison made between the two. As can be seen from the results of FIG. 10, there is a slight variation between the signals as originally encoded and those that have been decoded by the present invention. It should be noted that these differences are small enough not to be discernable to the human ear, and moreover, these differences can be virtually eliminated by simply optimizing the coefficients for more precise transfer functions.

The coefficient values used in the current embodiment were determined by trial and error for a selected number of frequencies at selected amplitudes until the transfer functions of the present invention for those signals matched the transfer function of the analog encoder of FIG. 2a. Additional coefficient values were then generated by relating coefficients to the variable resistors of the filters of FIGS. 4a and 4b. An approximate relationship was extracted which was used to generate the majority of the coefficients. Those of skill in the art will recognize that the generation of optimal coefficients can be accomplished in any number of ways. The manner in which coefficient values are generated for the preferred embodiment is included in the functional MATLAB description of the invention attached hereto as Appendix A.

It should be further noted that the decoder of the preferred embodiment as illustrated in FIG. 6 could be simply flipped around to create an encoder which would be capable of producing any encoding standard desired by the user. This would, of course, include standards such as Dolby SR.

Those of skill in the art will recognize that the preferred embodiment of the invention is implementable with a number of commercially available digital signal processors.

Such processors can be easily programmed in accordance with the foregoing detailed description and with reference to the MATLAB functional description which is attached hereto as Appendix A.

Although the noise reduction system of this invention has been described in terms of a preferred embodiment, it will be appreciated that various modifications and alterations might be made by those skilled in the art without departing from the spirit and scope of the invention. For example, the coefficient tables could be expanded by numbers of entries by increasing the number of frequencies and/or amplitudes represented. The greater the number of entries, the greater the accuracy of the transfer functions. The invention should therefore be measured in terms of the claims which follow.

APPENDIX A

```
% Create NRII coef. luts: Inverse coef.
structure H(z) = b0 + c(z)/a(z), where
c(z) = remainder b(z)/a(z)
load nrlut
[len,wid] = size(nrluth);
luth = zeros(len*5,1);
lutl = zeros(len*5,1);
for i=0:len-1,
b = nrluth(i+1,1:3);
a = nrluth(i+1,4:6);
[b0,c] = decoflv(b,a);
luth((i*5)+1:(i*5)+5) = [b0 -c(3) -c(2) -a(3) -a(2)];
b = nrlutl(i+1,1:3);
a = nrlutl(i+1,4:6);
[b0,c] = deconv(b,a);
lutl((i*5)+1:(i*5)+5) = [b0 -c(3) -c(2) -a(3) -a(2)];
end;
save nruth.dat luth /ascii
save nrluti.dat lutl /ascii
function [nrluth,nrlutl]=maknrlut()
% function computes filter coef table for NRII
% Q=[alf,lglf,lghf,ahf,hglf,hghf]
% creates a 11x100 entry table of coefs for
% amplitudes ranging from -80 to +20 dB and freq.ratios from 1 to 4
amp = [-60:10:0]; % amp is output of fixed band filter in dB
fr = 1:3/100:4-3/100; % fr is ratio of output of sliding filters
[blx,alx] = fillba(.9,1.52,0);
[bhx,abx] = fillba(.9,0,1.43);
klow = .05;
khigh = .05;
load rmats
load log2tab
[Hls,vls] = loslide;
[Hhs,vhs] = hislide;
[Hlf,vlf] = LFfixE;
[Hhf,vhf] = HFfixE;
for j = 1:176,
j
s2 = log2tab(j) + 1;
for i=1:length(amp),
s4 = amp(i);
s2lo = min(s2,max(Hls));
[r2lo,r4lo] = rmap(r2lomat,r4lomat,s2lo,s4,Hls,vls,Hlf,vlf);
QL = varlf(klow,r2lo,r4lo);
alf=QL(1);lglf=QL(2);lghf=QL(3);
[bv,av] = fillba(alf,lglf,lghf);
bl = conv(blx,bv);
al = conv(alx,av);
s2hi = min(s2,max(Hhs));
[r2hi,r4hi] = rmap(r2himat,r4himat,s2hi,s4,Hhs,vhs,Hhf,vhf);
QH = varhf(khigh,r2hi,r4hi);
ahf=QH(1);hglf=QH(2);hghf=QH(3);
[bv,av] = fillba(ahf,hglf,hghf);
bh = conv(bhx,bv);
ah = conv(ahx,av);
nrlutl((j-1)*length(amp)+i,:) = [bnl al];
nrluth((j-1)*length(amp)+i,:) = [bh ah];
end;
end;
save nrlut nrluth nrlutl
function [b,a]=fillba(p,g1,g2)
```

APPENDIX A-continued

```
% cwb 7/24/95
% Function computes transfer function of first order
% filter with pole at z=p, gain=g1 at z=1,
% and gain of g2 at z=-1.
% H = b/a
b0=.5*(g1+g2+p*(g2-g1));
b1=.5*(g1-g2-p*(g1+g2));
a1=1;
a2=-p;
b=[b0,b1];
a=[a1,a2];
function [H,f] = loslide
% cwb 8/25/95 9/14/95
% function generates sliding filter for LF module
fs=44100;
N=2048;
[b80,a80]=butter(1,80*2/fs);
[H80,f]=freqz(b80,a80,N,fs);
[b200,a200]=butter(1,200*2/fs);
[H200,f] =freqz(b200,a200,N,fs);
H=abs(H80./(.4*H200));
H=H(2:N);
f=f(2:N);
function[H,f]=hislide
% cwb 8/25/95 9/14/95
% function generates sliding filter for HF module
fs=44100,
N=2048;
[b10k,a10k]=buitter(1,10000*2/fs,'high');
[H10K,f]=freqz(b10k,a10k,N,fs);
[b3k,a3k]=butter(1,3000*2/fs,'high');
[H3k,f]=freqz(b3k,a3k,N,fs);
H3k=H3k(2:N);
H10k=H10k(2:N);
H=abs(H10k./(.2512957*H3k));
f=f(2:N);
function [Hmf]=-FfixE
% cwb 9/13/95
% function computes gain
% of LF fixed rand lowpass filter
fs=44100;
fs2=2/fs;
[b81,a81]=butter(1,675*fs2);
[b16,a16]=cheby2(3,45,5000*fs2);
[H81,f]=freqz(b81,a81,2048,fs);
[H16,f]=freqz(b16,a16,2048,fs);
H=H81.*H16;
function[H,f]=HFfixE
% cwb 9/13/95
% function computes gain
% of HF fixed band highpass filter
fs=44100;
fs2=2/fs;
[b8,a8]=butter(1,950*fs2,'high');
[b4,a4]=cheby2(3,45,110*fs2,'high');
[H8,f]=freqz(b8,a8,2048,fs);
[H4,f],freqz(b4,a4,2048,fs);
H=H4.*H8;
function(r2,r4)=rmap(r2mat,r4mat,s2,s4,Hs,vs,Hf,vf)
% cwb 8/21/95 8/25/95 9/14/95 9/15/95 ls 9/20/95
% function maps value of (s2,s4)
% to values of r2 and r4
%
[f,dB]=fback(s2,s4,Hs,vs,Hf,vf);
r2=rlut(r2mat,f,dB);
r4=rlut(r4mat,f,dB);
function[f,dB]=fback(s2,s4,Hs,vs,Hf,vf)
% cwb 9/14/95 ls 9/20/95
% function computes frequency
% of input signal from
% s2 output of sliding band filter
% s4 output of fixed band filter in dB
lf=interpl(log(Hs),log(vs),log(s2));
f=exp(lf);
[q,n]=min(abs(vf-f));
dB=s4-20*log10(abs(Hf(n))),
function QH=varhf(k,r2,r4)
% cwb 7/28/95
% function computes filter parameters for
```

APPENDIX A-continued

```
% variable part of HF module
% k=T/(2CR1), where T=sample period
% r2=R2/R1
% r4=R4/R3
% QH=[ahf,hglf.hghf]
% ahf=pole location in z-plane
% hglf=gain at z=1
% hghf=gain at; z=-1
temp=(1+r2)/r2;
ahf=(1-k*temp)/(1+k*temp);
hghf=1;
alpha=r4/(1+r4);
hglf=(alpha+r2)/(1+r2);
QH=[ahf,hglf,hghf];
function QL=varlf(k,r2,r4)
% cwb 7/28/95
% function computes filter parameters for
% variable part of LF module
% k=T/(2L/R1), where T=sample period
% r2=R2/R1
% r4=R4/R3
% QL=[alf lglf, lghf]
% alf=pole location in z-plane
% lglf gain at z=1,
% lghf=gain at z=-1
temp=r2/(1+r2);
alf=(1-k*temp)/((1+k*temp);
lglf=1;
alpha=r4/(1+r4);
lghf= (alpha+r2)/(1+r2);
QL=[alf,lglf,lghf];
1.0650000e-003
1.1250000e-003
1.1900000e-003
1.2550000e-003
1.3150000e-003
1.3750000e-003
1.4350001e-003
1.4950000e-003
1.5550000e-003
1.6150000e-003
1.6750000e-003
1.7400000e-003
1.8050000e-003
1.8650000e-003
1.9250000e-003
2.0150000e-003
2.1350003e-003
2.2550000e-003
2.3800000e-003
2.5050000e-003
2.6250000e-003
2.7450000e-003
2.8650000e-003
2.9900000e-003
3.1150000e-003
3.2350000e-003
3.3550000e-003
3.4800000e-003
3.6000000e-003
3.7250000e-003
3.8450000e-003
4.0300000e-003
4.2750000e-003
4.5150030e-003
4.7600000e-003
5.0050300e-003
5.2500000e-003
5.4950000e-003
5.7350000e-003
5.9830000e-003
6.2250000e-003
6.4700000e-003
6.7150000e-003
6.9600000e-003
7.2050000e-003
7.4450000e-003
7.6900000e-003
8.0600000e-003
```

APPENDIX A-continued

```
8.5450000e-003
9.0300000e-003
9.5200000e-003
1.0010000e-002
1.0500000e-002
1.0990000e-002
1.1475000e-002
1.1960000e-002
1.2450000e-002
1.2940000e-002
1.3430000e-002
1.3920000e-002
1.4405000e-002
1.4890000e-002
1.5380000e-002
1.6115000e-002
1.7090000e-002
1.8065000e-002
1.9045000e-002
1.9770000e-002
2.1000000e-002
2.1950000e-002
2.2950000e-002
2.3950000e-002
2.4900000e-002
2.5850000e-002
2.6850000e-002
2.7850000e-002
2.8800000e-002
2.9750000e-002
3.0750000e-002
3.2250000e-002
3.4200000e-002
3.6150000e-002
3.8100000e-002
4.0950000e-002
4.2000000e-002
4.3950000e-002
4.5900000e-002
4.7850000e-002
4.9800000e-002
5.1750000e-002
5.3700000e-002
5.6500000e-002
5.7600000e-002
5.9550000e-002
6.1500000e-002
6.4450000e-002
6.8400000e-002
7.2300000e-002
7.6200000e-002
8.0100000e-002
8.4000000e-002
8.7900000e-002
9.1800000e-002
9.5700000e-002
9.9600000e-002
1.0350000e-001
1.0740000e-001
1.1130000e-001
1.1520000e-001
1.1910000e-001
1.2300000e-001
1.2890000e-001
1.3675000e-001
1.4455000e-001
1.5235000e-001
1.6015000e-001
1.6795000e-001
1.7575000e-001
1.8355000e-001
1.9140000e-001
1.9765000e-001
2.0700000e-001
2.1450000e-001
2.2250000e-001
2.3050000e-001
2.3850000e-001
2.4600000e-001
```

APPENDIX A-continued 2.5750000e-001
2.7350000e-001
2.8900000e-001
3.0450000e-001
3.2050000e-001
3.3600000e-001
3.5150000e-001
3.6700000e-001
3.8250000e-001
3.9850000e-001
4.1400000e-001
4.2950000e-001
4.4550000e-001
4.6100000e-001
4.7650000e-001
4.9200000e-001
5.1550000e-001
5.4700000e-001
5.7800000e-001
6.0900000e-001
6.4050000e-001
6.7200000e-001
7.0300000e-001
7.3400000e-001
7.6550000e-001
7.9700000e-001
8.2800000e-001
8.5900000e-001
8.9050000e-001
9.2200000e-001
9.5300000e-001
9.8400000e-001
1.0310000e+000
1.0935000e+000
1.1560000e+000
1.2185000e+000
1.2810000e+000
1.3435000e+000
1.4060000e+000
1.4685000e+000
1.5310000e+000
1.5935000e+000
1.6560000e+000
1.7185000e+000
1.7810000e+000
1.8435000e+000
1.9060000e+000
1.9685000e+000
2.0000000e+000

| 0dB | −10 | −20 | −30 | −40 | −60 | |
|---|---|---|---|---|---|---|
| r2himat = | | | | | | |
| 8.0000 | 10.0000 | 10.0000 | 10.0000 | 15.0000 | 15.0000 | 20 Hz |
| 9.0000 | 10.0000 | 10.0000 | 10.0000 | 15.0000 | 15.0000 | 50 |
| 8.0000 | 10.0000 | 10.0000 | 10.0000 | 15.0000 | 15.0000 | 100 |
| 2.0000 | 3.0000 | 5.0000 | 8.0000 | 15.0000 | 15.0000 | 200 |
| 0.5000 | 0.6000 | 1.0000 | 2.0000 | 5.0000 | 15.0000 | 400 |
| 0.2500 | 0.3500 | 0.5000 | 0.8000 | 2.0000 | 15.0000 | 600 |
| 0.1800 | 0.2000 | 0.2500 | 0.4000 | 1.0000 | 15.0000 | 800 |
| 0.0600 | 0.0700 | 0.0800 | 0.1200 | 0.1500 | 15.0000 | 1600 |
| 0.0250 | 0.0300 | 0.0300 | 0.0300 | 0.0300 | 15.0000 | 3200 |
| 0.0080 | 0.0080 | 0.0080 | 0.0080 | 0.0080 | 15.0000 | 6400 |
| 0.0020 | 0.0020 | 0.0020 | 0.0020 | 0.0020 | 15.0000 | 12800 |
| r4himat = | | | | | | |
| 10.0000 | 10.0000 | 10.0000 | 10.0000 | 10.0000 | 25.0000 | |
| 10.0000 | 10.0000 | 10.0000 | 10.0000 | 10.0000 | 25.0000 | |
| 10.0000 | 10.0000 | 10.0000 | 10.0000 | 10.0000 | 25.0000 | |
| 0.1200 | 0.1200 | 0.1200 | 3.1200 | 0.1200 | 25.0000 | |
| 0.1200 | 0.1200 | 0.1200 | 0.1200 | 0.1200 | 25.0000 | |
| 0.0800 | 0.2000 | 0.4200 | 0.5000 | 1.0000 | 25.0000 | |
| 0.0400 | 0.3500 | 0.7500 | 0.8000 | 1.5000 | 25.0000 | |
| 0.0550 | 0.2300 | 0.5500 | 0.8000 | 2.0000 | 23.0000 | |
| 0.0500 | 0.2300 | 0.4300 | 0.8000 | 1.5000 | 20.0000 | |
| 0.0600 | 0.1800 | 0.3700 | 0.6500 | 1.5000 | 15.0000 | |
| 0.0600 | 0.1200 | 0.3000 | 0.6500 | 1.5000 | 15.0000 | |

APPENDIX A-continued r21omat =

| 0.0035 | 0.0040 | 0.0050 | 0.0050 | 0.0050 | 10.0000 |
|---|---|---|---|---|---|
| 0.0085 | 0.0100 | 0.0120 | 0.0130 | 0.0150 | 10.0000 |
| 0.0200 | 0.0250 | 0.0350 | 0.0400 | 0.1000 | 10.0000 |
| 0.0450 | 0.0600 | 0.0800 | 0.1000 | 0.1500 | 10.0000 |
| 0.1100 | 0.1400 | 0.1800 | 0.3000 | 0.5000 | 10.0000 |
| 0.1700 | 0.2600 | 0.4148 | 0.9500 | 2.0000 | 10.0000 |
| 0.2400 | 0.4000 | 0.7500 | 1.5000 | 3.0000 | 10.0000 |
| 0.8000 | 1.5000 | 2.0000 | 3.0000 | 3.0000 | 10.0000 |
| 3.0000 | 3.0000 | 3.0000 | 3.0000 | 3.0000 | 10.0000 |
| 3.0000 | 3.0000 | 3.0000 | 3.0000 | 3.0000 | 10.0000 |
| 10.0000 | 10.0000 | 10.0000 | 10.0000 | 10.0000 | 10.0000 | r41omat =

| 0.1000 | 0.2300 | 0.6000 | 2.0000 | 10.0000 | 25.0000 |
|---|---|---|---|---|---|
| 0.1000 | 0.2308 | 0.6000 | 1.6000 | 10.0000 | 25.0000 |
| 0.1000 | 0.2300 | 0.6000 | 1.5000 | 5.0000 | 25.0000 |
| 0.0800 | 0.2500 | 0.7000 | 1.6000 | 10.0000 | 25.0000 |
| 0.0300 | 0.3500 | 0.8500 | 1.6000 | 10.0000 | 25.0000 |
| 0.0400 | 0.2500 | 0.6500 | 0.7000 | 10.0000 | 25.0000 |
| 0.1000 | 0.1000 | 0.1000 | 0.1000 | 0.1000 | 25.0000 |
| 0.2000 | 0.2000 | 0.2000 | 0.2000 | 0.2000 | 23.0000 |
| 2.0000 | 2.0000 | 2.0000 | 2.0000 | 2.0000 | 20.0000 |
| 2.0000 | 2.0000 | 2.0000 | 2.0000 | 2.0000 | 20.0000 |
| 2.0000 | 2.0000 | 2.0000 | 2.0000 | 2.0000 | 20.0000 |

What is claimed is:

1. For an audio signal which has been encoded using an analog encoder having an encoder transfer function, a method of decoding said encoded audio signal comprising the steps of:
providing a plurality of digital filter stages in cascade, wherein at least one of the digital filter stages includes at least one feedback path having a feedback-path transfer function which returns a feedback signal to be summed with the encoded audio signal, said at least one digital filter stage further including a forward path including a gain element having a forward-path transfer function for processing the summed signal said feedback-path transfer function and forward-path transfer function defining a dynamic decoder transfer function:
filtering the encoded audio signal through said digital filter stages to provide a decoded signal; and
modifying at least one of said feedback-path and forward-path transfer functions in accordance with the decoded signal so that the decoder transfer function emulates the encoder transfer function.

2. The method as in claim 1 wherein the step of modifying said feedback-path and forward-path transfer functions comprises the step of assigning filter coefficients for at least one of said feedback-path and forward-path transfer functions.

3. The method as in claim 2 wherein the step of assigning filter coefficients comprises the step of digitally computing said filter coefficients.

4. The method as in claim 3 wherein the step of digitally computing comprises the steps of providing a table of filter coefficients, selecting filter coefficients and interpolating said filter coefficients from the table to be assigned to said transfer functions.

5. The method as in claim 4 wherein the selection of said filter coefficients is done in accordance with the frequency and amplitude characteristics of said decoded signal from the last of said digital filter stages.

6. The method as in claim 5 wherein the frequency and amplitude characteristics of the decoded signal are of the dominant spectral components within one or more frequency bands.

7. The method as in claim 6 further comprising the step of providing a deskewing filter after the last of said digital filter stages.

8. The method as in claim 1 wherein the encoded audio signal is a signal encoded in accordance with a Dolby SR type noise reduction scheme.

9. The method as in claim 3 wherein the encoded audio signal is a signal encoded in accordance with an analog noise reduction scheme.

10. The method as in claim 1 wherein the encoded audio signal is a signal encoded from an original audio signal in accordance with the steps comprising:

filtering the original audio signal through at least one digital filter stage to provide an encoded signal, said digital filter stage defining said encoder transfer function; and modifying said encoder transfer function in accordance with the original audio signal.

11. A digital decoder for decoding an audio signal which has been encoded using an analog encoder having an encoder transfer function, said digital decoder comprising:

a plurality of digital filter stages configured in cascade, wherein at least one of the digital filter stages includes at least one feedback path having a feedback-path transfer function which returns a feedback signal to be summed with the encoded audio signal, said at least one digital filter stage further including a forward path including a gain element having a forward-path transfer function for processing the summed signal, said feedback-path transfer function and forward-path transfer function defining a dynamic decoder transfer function said digital filter stages for filtering the encoded signal to provide a decoded signal; and a controller for receiving said decoded signal and modifying at least one of said feedback-path and forward-path transfer functions in accordance with the received decoded signal so that the decoder transfer function emulates the encoder transfer function.

12. The digital decoder as in claim 11 wherein said controller modifies said feedback-path and forward-path transfer functions by assigning filter coefficients for at least one of said feedback-path and forward-path transfer functions.

13. The digital decoder as in claim 12 wherein said controller digitally computes the filter coefficients to be assigned to the transfer function.

14. The digital decoder as in claim 13 wherein said controller comprises a table of filter coefficients and said controller digitally computes and then interpolates the filter coefficients to be assigned to said transfer functions.

15. The digital decoder as in claim 14 further comprising means for feeding back, to said controller, the frequency and amplitude characteristics of the decoded signal from the last of said digital filter stages and wherein said controller computes and interpolates the filter coefficients to be assigned according to such feedback.

16. The digital decoder as in claim 15 wherein said feedback of the frequency and amplitude characteristics of the decoded signal are of the dominant spectral components within one or more frequency bands.

17. The digital decoder as in claim 16 further comprising a deskewing filter positioned after said last digital filter stage.

18. The digital decoder as in claim 11 wherein said encoded audio signal is a signal encoded in accordance with an analog noise reduction scheme.

19. The digital decoder as in claim 11 wherein said encoded audio signal is a signal encoded from an original audio signal using an encoder comprising:

at least one digital filter stage for filtering said original audio signal to provide an encoded signal, said digital filter stage defining said encoder transfer function; and a controller for receiving said original audio signal and modifying said encoder transfer function in accordance with said original audio signal.

20. An apparatus for decoding an audio signal which has been encoded by an encoder having an overall encode transfer function, the encoder having at least one filter stage, said filter stave having at least one encode filter section, said encode filter section characterized by an encode-filter-section transfer function said apparatus comprising:

a plurality of digital filter stages connected in series, said digital filter stages for filtering the encoded signal to provide a decoded signal, said plurality of digital filter stages having a dynamic overall decode transfer function, each of said digital filter stages including:

a summing device;

at least one feedback signal path including one decode filter section characterized by a dynamic decode-filter-section transfer function, said feedback path providing a decode-filter-section output to said summing device; and a forward signal path including a gain section characterized by a gain-section transfer function, said forward signal path providing a gain component to said decode filter section and to the next of said digital filter stages in series; and said apparatus further comprising a controller for receiving said decoded signal and modifying said decode-filter-section transfer functions and said gain-section transfer function in accordance with the received decoded signal:

wherein said decode-filter-section transfer functions are different than said encode-filter-section transfer functions and the controller modifies said decode-filter-section transfer functions such that the overall decode transfer function emulates the overall encode transfer function.

21. The apparatus of claim 20 wherein said controller modifies said decode-filter-section transfer functions and said gain-section transfer function by providing filter coefficients to said filter sections and gain section.

22. The apparatus of claim 20 wherein said filter sections have transfer functions which are proper rational functions.

23. The apparatus of claim 22 wherein said filter sections are implemented as second-order biquadratic filters to implement two-pole Butterworth filters.

24. An apparatus for encoding an audio signal, said apparatus comprising:

a plurality of digital filter stages arranged in series, said digital filter stages for filtering the audio signal to provide an encoded signal, each digital filter stage including:

a summing device responsive to signals and producing as output a signal to the next of said digital filter stages in series;

at least one forward signal path including an encode filter section characterized by a dynamic encode-filter-section transfer function, said forward path providing an encode-filter-section output to said summing device; and an additional forward signal path including a gain section characterized by a gain-section transfer function, said additional forward signal path providing a gain component to said summing device, and said apparatus further comprising a controller for receiving said audio signal and modifying said encode-filter-section transfer functions and said gain-section transfer function in accordance with the audio signal.

25. The apparatus of claim 24 wherein said controller modifies said encode-filter-section transfer functions and said gain-section transfer function by providing filter coefficients to said filter sections and said gain section.

26. The apparatus of claim 24 wherein said filter sections have transfer functions which are proper rational functions.

* * * * *

UNITED STATES PATENT AND TRADEMARK OFFICE
CERTIFICATE OF CORRECTION

PATENT NO. : 5,910,995
DATED : June 8, 1999
INVENTOR(S) : Laura Mercs, Paul M. Embree, Casper W. Barnes It is certified that error appears in the above-identified patent and that said Letters Patent is hereby corrected as shown below:

Column 17, claim 9, line 7, change "3", to read --1--.

Signed and Sealed this

Ninth Day of November, 1999

Attest:

Q. TODD DICKINSON

Attesting Officer

Acting Commissioner of Patents and Trademarks